United States Patent
Kato et al.

(10) Patent No.: US 7,620,528 B2
(45) Date of Patent: Nov. 17, 2009

(54) METHOD AND PROGRAM FOR LABELING MULTI MATERIAL DATA

(75) Inventors: Masaya Kato, Wako (JP); Kiwamu Kase, Wako (JP); Tomonori Yamada, Wako (JP)

(73) Assignee: Riken, Saitama (JP)

( * ) Notice: Subject to any disclaimer, the term of this patent is extended or adjusted under 35 U.S.C. 154(b) by 616 days.

(21) Appl. No.: 10/553,602

(22) PCT Filed: May 10, 2004

(86) PCT No.: PCT/JP2004/006563

§ 371 (c)(1),
(2), (4) Date: Oct. 18, 2005

(87) PCT Pub. No.: WO2004/100024

PCT Pub. Date: Nov. 18, 2004

(65) Prior Publication Data

US 2006/0267974 A1    Nov. 30, 2006

(30) Foreign Application Priority Data

May 9, 2003    (JP)    ............................. 2003-131313

(51) Int. Cl.
*G06F 7/60* (2006.01)
*G06F 17/00* (2006.01)
*G06G 7/48* (2006.01)
*G06T 15/00* (2006.01)

(52) U.S. Cl. ............................. 703/2; 703/6; 345/418; 345/419

(58) Field of Classification Search ...................... 703/2, 703/6; 345/418, 419
See application file for complete search history.

(56) References Cited

U.S. PATENT DOCUMENTS 6,529,192 B1 *    3/2003    Waupotitsch ............... 345/419

(Continued)

FOREIGN PATENT DOCUMENTS

EP    1 229 463 A2    8/2002

(Continued)

OTHER PUBLICATIONS

"Tetrahedral Finite Element Mesh Generation from NURBS Solid Models", H.N. Gursoy. Engineering with Computers 1996.*

(Continued)

*Primary Examiner*—Kidest Bahta
*Assistant Examiner*—Nithya Janakiraman
(74) *Attorney, Agent, or Firm*—Griffin & Szipl, P.C.

(57) ABSTRACT

The present invention includes an external data acquisition step (S1), an external data input step (A), a cell division step (B), a cell classification step (C), a space classification step (D), a simulation step (S3), and an output step (S4). The cell classification step (C) includes a step of further classifying each of the boundary cells (13a) into a first type cell and a second type cell. The first type cell has a cutting point at which an edge line or vertex is cut by the boundary data. The second type cell has a cutting point that lies on a boundary with another cell of different hierarchy, and is larger than the another cell. The cell classification step (C) further includes a step of assigning a material number to each cell vertex.

5 Claims, 10 Drawing Sheets

U.S. PATENT DOCUMENTS

| | | | |
|---|---|---|---|
| 7,388,584 B2* | 6/2008 | Kase | 345/424 |
| 2003/0028090 A1* | 2/2003 | Raghavan et al. | 600/407 |

FOREIGN PATENT DOCUMENTS

| | | |
|---|---|---|
| JP | 08-153214 | 6/1996 |
| JP | 08-221386 | 8/1996 |
| JP | 09-081783 | 3/1997 |
| JP | 11-096399 | 4/1999 |
| JP | 2002-230054 | 8/2002 |
| JP | 2003-330976 | 11/2003 |

OTHER PUBLICATIONS

Rosenfeld, Azriel et al., "Digital Picture Processing", 1976, Academic Press, Inc. pp. 352-357.

Szeliski, Richard, "Rapid Octree Construction from Image Sequences", CVGIP: Image Understanding, vol. 58, No. 1, Jul. 1993, pp. 23-32.

Yonezawa, Kazutoshi et al., "A Geometric Modeler by Using Spatial-Partitioning Representations", vol. 37, No. 1, Jan. 1996, pp. 60-69.

International Search Report issued in corresponding application No. PCT/JP2004/006563 completed Jun. 3, 2004 and mailed Jun. 22, 2004.

Bloomenthal, Jules et al., "Polygonization of Non-Manifold Implicit Surfaces," Computer Graphics Proceedings, Annual Conference Series, Aug. 6, 1995, pp. 309-316.

Ju, Tao, et al. "Dual Contouring of Hermite Data," pp. 339-346, Copyright 2002.

Lira, William M., et al. "An OOP Approach for Mesh Generation of Multi-Region Models with NURBS," 2001 IEEE, pp. 18-25.

Kase, K. et al., "Volume CAD", Volume Graphics, pp. 145-173, 2003.

Kase, Kiwamu, et al., "Volume CAD-CW-complexes based approach," Computer Aided Design, May 18, 2005, pp. 1509-1590.

Supplemental European Search Report issued in corresponding application No. EP 04 73 2016, completed Oct. 25, 2006 and mailed Nov. 9, 2006.

O'Rourke, Joseph, "Computational Geometry in C", Second Edition, pp. 246-253, 2001.

Curless, Brian et al., "A Volumetric Method for Building Complex Models from Range Images", pp. 1-10, 1996.

Pulli, Kari et al., "Robust Meshes from Multiple Range Maps", 1997.

Kobori, Ken-ichi et al., "Conversion of Spatial Partitioning Model into Boundary Representations", pp. 1230-1239, 1995.

Lorensen, William E. et al., "Marching Cubes. A High Resolution 3D Surface Construction Algorithm," Computer Graphics, vol. 21, No. 4, pp. 163-169, Jul. 1, 1987.

\* cited by examiner

METHOD AND PROGRAM FOR LABELING MULTI MATERIAL DATA

This is a National Phase Application in the United States of International Patent Application No. PCT/JP2004/006563 filed May 10, 2004, which claims priority on Japanese Patent Application No. 131313/2003, filed May 9, 2003. The entire disclosures of the above patent applications are hereby incorporated by reference.

BACKGROUND OF THE INVENTION

1. Technical Field of the Invention

The present invention relates to a multi-material data labeling method and program for determining the insides/outsides of two-dimensional or three-dimensional boundary surfaces.

2. Description of Related Art

In the field of technology research and development, CAD (Computer Aided Design), CAM (Computer Aided Manufacturing), CAE (Computer Aided Engineering), CAT (Computer Aided Testing), and the like are used as simulation means for designing, machining, analyzing, and testing, respectively.

In addition, C-Simulation (Corporative Simulation) as continuous simulation, A-CAM (Advanced CAM) which also considers a machining process, and D-fabrication (Deterministic fabrication) providing ultimate accuracy are becoming widespread.

In the conventional simulation means mentioned above, the boundary surfaces of an object are important. For example, it is common practice to represent the object by the boundary surfaces, and the inside of the boundary surfaces is handled uniformly. In such a case, it is necessary to use an identification method for determining the insides/outsides of two-dimensional or three-dimensional boundary surfaces.

As conventional inside/outside determination methods, there are known (1) a ray crossing method, (2) a region growing (expanding) method using boundary tracking, (3) raster tracking in image processing, (4) multidirectional tracking, (5) a Curless method, (6) a Szeliski method and a Pulli method using an octree, Patent Document 1, Patent Document 2, and so on. Further, Patent Document 3 and Patent Document 4, both related to the present invention, were filed.

[Patent Document 1]
Japanese Laid-Open Patent Publication No. 09-81783.

[Patent Document 2]
Japanese Laid-Open Patent Publication No. 08-153214.

[Patent Document 3]
Japanese Laid-Open Patent Publication No. 2002-230054.

[Patent Document 4]
Japanese Patent Application No. 2002-142260, unpublished.

(1) In the region growing (expanding) method (ray crossing method), when an input boundary surface is present, the inside or outside of an object is determined based on whether the number of intersecting points between the boundary and each of rays (half-lines) emanating from a certain point is even or odd. That is, when the number of intersecting points is even, it is determined that the starting point (endpoint) of the ray is outside the object, or when the number of intersecting points is odd, it is determined that it is inside the object. This region growing (expanding) method is disclosed, for example, in *Computational Geometry in C*, second edition (J. O'Rourke, p. 246, Cambridge University Press, 1998).

However, the region growing (expanding) method cannot be applied to a case where rays come into accidental contact with a boundary, because this expansion has a repeated root so that two intersecting points will become one. It cannot also be applied to a case where there is a defect in boundary information (when data such as CAD data are read from different software, the data may be lost due to differences in representation or numerical value errors).

(2) The region growing (expanding) method using boundary tracking in image processing when only boundary information is given is disclosed in *Digital Picture Processing* (Rosenfeld & Kak, translated by Nagao, Kindaikagakusha, pp. 353-357), for example. However, since the processing is performed over the entire region, it takes time. Further, when there is a defect in surface information, the determination cannot be made properly.

(3) The raster tracking in image processing is disclosed in the above-mentioned book, *Digital Picture Processing* (p. 334). It is a method of tracking a boundary and a region sandwiched between boundaries while scanning cells along a coordinate axis such as an X axis. However, when a quantized image is formed from defective boundary information, for example when the surface is not a closed surface, proper determination cannot be made.

(4) In order to avoid this problem, multidirectional tracking (disclosed in the above-mentioned book, p. 332) can be used, but the efficiency of this method is low.

(5) The Curless method in the field of reverse engineering (for restructuring surface information from a group of measured points) is a robust method of defining, over the entire field, an implicit function based on distance using external information, such as regularly arranged measured points and plural camera directions to a measured object, to reconstruct surface information. This method is disclosed in "A volumetric method for building complex models from range images" (B. Curless and M. Levoy, *In Proceedings of SIGGRAPH '96*, pages 303-312, August 1996).

However, in the Curless method, since it is necessary to perform distance field calculations for all cells, this method has demerits in terms of data amount and calculation time. A problem of accuracy is also pointed out with this method, such as that the distance function cannot be calculated accurately for a structure thinner than the cell size or acute surface geometries. This results in an error in the determination.

(6) The Szeliski method (R. Szeliski, "Rapid octree construction from image sequences") and the Pulli method ("Robust meshes from multiple range maps" by K. Pulli, T. Duchamp, H. Hoppe, J. McDonald, L. Hapiro, and W. Stuetzle in *Proceedings of International Conference on Recent Advances in 3-D Digital Imaging and Modeling*, May 1997, pp. 205-211), both using an octree, are methods of classifying, into the inside, outside, and boundary categories, the relations between several pieces of target range data (distance data) and cells generated by dividing space into an octree to reconstruct boundaries. These methods use projection operations for each cell, so that processing becomes complicated and takes time, resulting in unsteady calculations in the projection operations.

Patent Document 1 entitled "System and method for finite element model processing" is to judge whether the area of a target divided element agrees with the sum of the areas of triangles each having, as its vertices, nodes on the respective sides of the divided element and a node to be determined. However, there is a problem that this method cannot be applied to a case where there is a defect in the boundary information.

Patent Document 2 teaches an inside/outside determination method using voxels. This method has limitations that it is not available for hierarchization and it can cope with only two types of materials because of use of a data reversing operation.

Patent Document 4 entitled "Boundary data inside/outside judgment method and program thereof" supports "up to two types of materials per cell" in a data holding format described in Patent Document 3. This method is multi-material compliant from a broad view, or to put it in another way, it can handle only two type of materials per cell. Therefore, for rendering a state necessary to handle multiple materials, that is, such a state that three or more materials border one another, corresponding parts have to be divided finely more than necessary, or even such fine divisions may not be enough for accurate representation.

SUMMARY OF THE INVENTION

The present invention was made in order to solve the above problems. It is an object of the present invention to provide an labeling method and program, which is so robust against any defect in boundary information that it can identify the boundary information even if there is a defect in the boundary information, make processing time short, make processing speed high, make implementation into a computer easy, reduce the risk of classifying different spaces as one space, and extend its application to multiple spaces.

It allows a wide range of applications, such as (1) simulations for structural analysis, large deformation analysis, heat and fluid analysis, flow analysis, removal machining, addition machining, and deformation machining, (2) simulation and inspection of an object model in which a living body such as a human body is mixed with artifacts and designing and machining of the artifacts, and (3) designing, analyzing, machining, assembling, and testing in cases where natural things and artifacts, like the Earth's crusts and buildings, are mixed.

In one aspect of the present invention, there is provided a method for labeling multi material data, for a sequence of processing steps using a computer, the steps including acquisition of external data (12), storage of cell data through octree division of the external data, and simulation using the cell data, the method comprising:

an external data acquisition step (S1) of acquiring the external data (12) composed of boundary data and physical property values of an object (1);

an external data input step (A) of inputting the external data (12) into a computer;

a cell division step (B) of dividing the external data into rectangular solid cells (13) having boundary planes orthogonal to each other;

a cell classification step (C) of classifying each of the divided cells into a boundary cell (13a) including the boundary data, and a non-boundary cell (13b) not including the boundary data;

a space classification step (D) of classifying the vertices of each cell into multiple spaces partitioned by the boundary data;

a simulation step (S3) of performing a simulation using the physical property values for each cell; and an output step (S4) of outputting simulation results, wherein the cell classification step (C) comprises the steps of:

further classifying each of the boundary cells (13a) into a first type cell and a second type cell, the first type cell having a cutting point at which an edge line or vertex is cut by the boundary data, the second type cell having a cutting point that lies on a boundary with another cell of different hierarchy, and the second type cell being larger than the another cell; and assigning a material number to each cell vertex.

In another aspect of the present invention, there is provided a program for labeling multi material data, using a computer to perform:

an external data input step (A) of inputting external data (12) composed of boundary data of an object;

a cell division step (B) of dividing the external data into rectangular solid cells (13) having boundary planes orthogonal to each other;

a cell classification step (C) of classifying each of the divided cells into a boundary cell (13a) including the boundary data, and a non-boundary cell (13b) not including the boundary data; and a space classification step (D) of classifying the vertices of each cell into multiple spaces partitioned by the boundary data.

According to the method and program of the present invention, all pieces of external data (12) are divided in the cell division step (B) into rectangular solid cells (13) with boundary planes orthogonal to each other, and each of the divided cells is classified in the cell classification step (C) into the boundary cell (13a) and the non-boundary cell (13b). Therefore, even if there is a defect in the boundary data (12), each piece of external data will always be classified as either the boundary cell (13a) or the non-boundary cell (13b).

Further, since the rectangular solid cells (13) are larger than the original boundary data, the boundary cell (13a) can be determined as including only part of the boundary data (for example, one point in the boundary data) so that the boundary data will always be included in the boundary cells (13a). Even if there is a defect in the boundary information such as a loss of data, the boundary data including the loss will always be included in the boundary cell (13a) unless the dimensions of the missing data exceed those of the rectangular solid cell (13).

Thus, the method and program of the present invention is so robust against any defect in the boundary information that it can identify the boundary information even if there is a defect in the boundary information.

Further, cells (transit cells), each having a cutting point on the boundary with another cell of different hierarchy and being larger than the cell concerned, are set so that only the necessary part where a hierarchical difference occurs can be subdivided without causing boundary mismatch in that part, thereby enabling a reduction in required memory size and hence high speed processing.

In addition, since a material number is assigned to each vertex, a finer identification is possible.

According to a preferred embodiment of the present invention, the space classification step (D) further comprises:

a non-boundary cell setting step (D1) of assigning all the non-boundary cells space numbers different for respective spaces partitioned by boundary data; and a boundary cell setting step (D2) of assigning each vertex of the boundary cell the space number of the neighboring non-boundary cell that is not partitioned by the boundary data.

In this method, the non-boundary cell setting step (D1) and the boundary cell setting step (D2) have only to be performed once on all the rectangular solid cells (13), respectively, so that the vertices of all the cells can be classified into multiple spaces partitioned by the boundary data.

Therefore, even if the number n of cells is large, the processing time is just on the order of O (n) (proportional to n), thereby enabling high speed processing.

Further, the calculation procedure is so simple that the method can be easily programmed or implemented in a computer.

Furthermore, multiple spaces partitioned by the boundary cells (13a) are assigned different space numbers k, so that the risk of classifying different spaces as one space is reduced, thereby enabling its application to multiple spaces.

The boundary cell setting step (D2) comprises a step of assigning a vertex matching the boundary data either of the space numbers of two neighboring non-boundary cells.

The vertex matching the boundary data included in the two non-boundary cells is assigned either of the neighboring space numbers, thus enabling the classification of the vertices of all the cells as a single space, respectively.

Preferably, the cell division step (B) comprises a step of re-dividing the rectangular solid cells (13) by octree division until a number of cutting points enough to reconstruct boundary shape elements forming the boundary face included in the external data are obtained.

Preferably, the cell classification step (C) comprises the steps of: further classifying each of the boundary cells (13a) into a first type cell and a second type cell, the first type cell having a cutting point at which an edge line or vertex is cut by the boundary data, the second type cell having a cutting point that lies on a boundary with another cell of different hierarchy, and the second type cell being larger than the another cell.

In this method, the octree division can make the method applicable to VCAD data.

Preferably, the division step (B) comprises a step of dividing voxel data into rectangular solid cells (13) of the same size.

In this method, since the voxel data are divided by the same size, the method can handle normal voxel data.

The non-boundary cell setting step (D1) comprises a step of scanning all the rectangular solid cells (13) repeatedly in sequence, or in recursive processing, in the three directions of X, Y, and Z.

In case of voxel data, the step is repeated in sequence in the three directions of X, Y, and Z, while in case of VCAD data, all the rectangular solid cells (13) can be scanned in recursive processing.

Other objects and advantageous features of the present invention will become apparent from the following description with reference to the accompanying drawings.

DESCRIPTION OF THE PREFERRED EMBODIMENT

A preferred embodiment will now be described with reference to the drawings.

The inventors of the present invention made and filed a preceding invention entitled "Method for storing substantial data formed by integrating shape and physical property" (Patent Document 3). This method relates to a storage method for allowing the storage of substantial data integrating the shape and physical property with a small memory capacity. Therefore, it is possible to manage the shape, structure, physical property information, and history of an object in an integrated fashion, and hence to manage, as the same data, data related to a series of processes such as designing, machining, assembling, testing, and evaluating. Thus, the method can integrate CAD and simulation. The data in this method is referred to as "VCAD data," and designing and simulation using this type of data is referred to as "volume CAD" or "VCAD."

The multi-material data labeling method of the present invention is particularly suitable for the application to VCAD data, but it is not limited to this application. This method can also be applied to normal voxel data in the same manner.

First, the terms used to describe the present invention are defined below.

The term "cell" refers to the surface of a rectangular solid that divides three-dimensional space and an internal region of the rectangular solid, such as a voxel or octant in an octree when input boundary (surface) data is present. Among the cells, cells with surface information are referred to as "boundary cells," while cells without surface information are referred to as "non-boundary cells" or "inner cells" in Patent Document 3.

As will be described later, the boundary cells are classified into basic boundary cells and transit cells according to the present invention.

It is assumed that a target three-dimensional space (referred to as "volume world" or simply "world") has finite dimensions. The world is covered with two types of cells, i.e., the boundary cells and the non-boundary cells, with no space therebetween in such a manner that the internal regions of the cells will not overlap one another (this structure is referred to as cell complex).

In other words, the boundary cell has an intersecting point with input boundary data in the inside of each cell, or on one or more of the faces, edges, and vertices constituting the boundary between cells. The cell that does not have such an intersecting point is the non-boundary cell. The neighboring cells share only the cell boundary irrespective of the type of cell. An object having a two-dimensional manifold as its boundary and a three-dimensionally filled inside is referred to as "space." Respective spaces that are not coupled to one another are recognized as different spaces. Accordingly, the space indicates a part (a group of points) surrounded by boundaries (faces) each represented by a closed surface, and is used as a unit to determine an object of the same material in the real world. On the other hand, the border that distinguishes between different spaces is referred to as "boundary" (the same definition as boundary in mathematics) or "surface."

Figure 1:
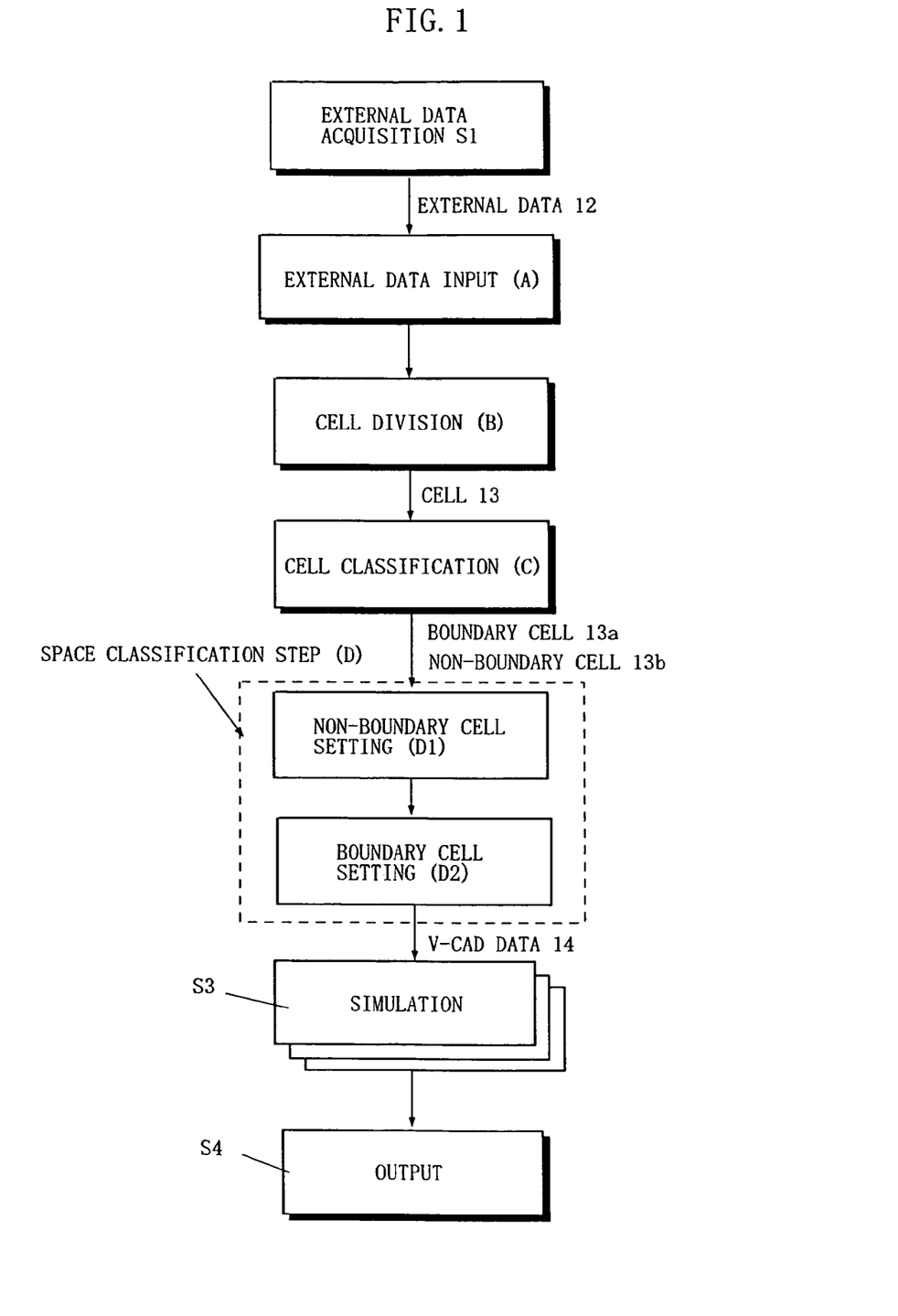
FIG. 1 is a flowchart of a multi-material labeling method according to the present invention.

FIG. 1 is a flowchart of the multi-material labeling method of the present invention. As shown, the method of the present invention is to perform a sequence of processing steps in a simulation process for structural analysis, large deformation analysis, heat and fluid analysis, flow analysis, removal machining, addition machining, or deformation machining using a computer from acquisition of external data (12) to storage of cell data and simulation using the cell data stored through the process of octree division of the external data. The method includes an external data acquisition step (S1), an external data input step (A), a cell division step (B), a cell classification step (C), a space classification step (D), a simulation step (S3), and an output step (S4).

In the external data acquisition step (S1), external data 12 composed of boundary data and the physical property values of an object 1 is acquired.

In the external data input step (A), the external data 12 composed of the boundary data and the physical property values of the object 1 acquired in the external data acquisition step S1 is input into a computer or the like storing the method of the present invention. In the cell division step (B), the external data 12 is divided into rectangular solid cells having boundary surfaces orthogonal to each other. The rectangular solid cells 13 may be cube cells instead of the rectangular solid cells.

In the cell classification step (C), the divided cells are classified into boundary cells 13a including boundary data and non-boundary cells 13b not including boundary data. The boundary cells 13a include transit cells to be described later.

In the space classification step (D), the vertices of each cell 13 are classified into a plurality of spaces partitioned by the boundary data.

In the simulation step (S3), simulations such as designing, analyzing, machining, assembling, and testing are performed using the physical property values for each cell. In the output step (S4), the simulation results are output, for example, to a printer or external NC apparatus.

When the method of the present invention is applied to VCAD data, the rectangular solid cells 13 are re-divided into an octree until a number of cutting points enough to reconstruct boundary shape elements forming the boundary faces included in the external data are obtained. Then, in the cell classification step (C), each of the boundary cells (13a) is further classified into a first type cell and a second type cell. The first type cell has a cutting point at which an edge line or vertex is cut by the boundary data. The second type cell has a cutting point that lies on a boundary with another cell of different hierarchy, and is larger than the another cell. Further in the cell classification step (C), a material number is assigned to each cell vertex.

On the other hand, when it is applied to normal voxel data, each cell is divided into rectangular solid cells 13 of the same size in the cell division step (B).

Figure 2A:
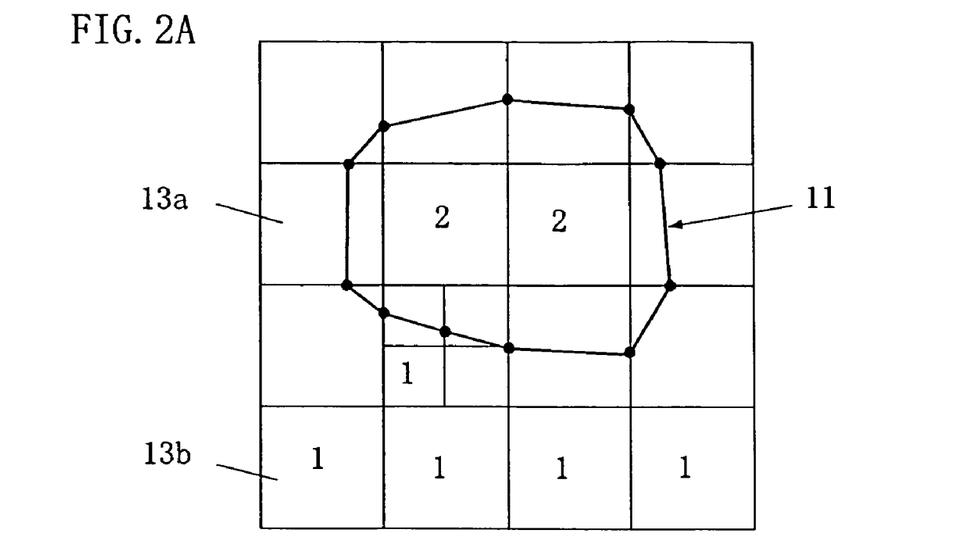
FIGS. 2A and 2B are diagrammatic illustrations of a space classification step (D) in two dimensions.
Figure 2B:
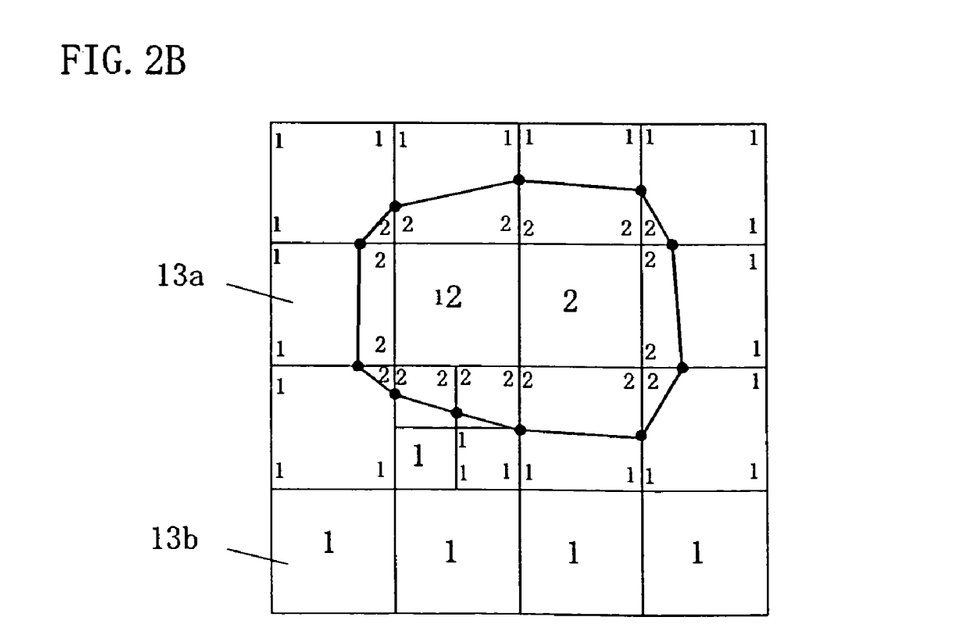

FIGS. 2A and 2B are diagrammatic illustrations of the space classification step (D) in two dimensions. As shown in FIGS. 1, 2A, and 2B, the space classification step (D) includes a non-boundary cell setting step (D1) and a boundary cell setting step (D2).

In the non-boundary cell setting step (D1), all the non-boundary cells 13b are assigned different space numbers for respective spaces partitioned by boundary data 11. The space number K takes on integers, for example, 1, 2, 3, . . . and it is recommended to use the integers in order from the smallest to the largest number.

In this step (D1), all the rectangular solid cells 13 are scanned one after another in the three directions of X, Y, and Z repeatedly in sequence or in recursive processing. If the scanning crosses any boundary cell 13a, a different space number (for example, K=K+1) will be assigned. Further, during scanning, if neighboring cells that are not partitioned by the boundary data are assigned different space numbers, it will be preferable to re-assign them the smaller space number.

In the boundary cell setting step (D2), a vertex of a boundary cell 13a that borders the vertices of neighboring non-boundary cells is assigned the space number of the neighboring non-boundary cells that are not partitioned by the boundary data. Further, in this step (D2), a vertex matching the boundary data is assigned either of the space numbers of two neighboring non-boundary cells.

When the method is applied to normal voxel data, the non-boundary cell setting step (D1) is repeated in sequence in the three directions of X, Y, and Z. On the other hand, when it is applied to VCAD data, all the rectangular solid cells 13 are scanned in sequence in recursive processing. Boundary information on each space and the minimum resolution for dividing the world are required as input data. The boundary information that is partially missing as a result of conversion or calculation is allowable.

The external data 12 input from the outside is polygon data representing a polyhedron, tetrahedral or hexahedral elements used in a finite element method, curved surface data used in a three-dimensional CAD or CG tool, or data for representing the surfaces of other three-dimensional shapes by using information composed of partial planes and partial curved surfaces.

Instead of such data, the external data 12 may be data generated directly by user input through a VCAD-specific interface, (2) surface data digitized by a measuring instrument, sensor, or digitizer, or volume data having internal information such as voxel data used in CT scanning, MRI, or normal volume rendering.

Output data is VCAD data composed of the boundaries of two-dimensional manifolds labeled with different numbers for respective spaces, and cells having sizes equal to or more than the size of the minimum space resolution. This VCAD data includes all the spaces filled with cells directly having boundaries (boundary cells) and cells without boundaries (non-boundary cells).

In FIGS. 2A and 2B, the term "label" is used as a number (space number) for distinguishing between spaces. The cell type (boundary cell or internal cell) is previously determined in the cell classification step (C). The cell type can be easily determined based on whether there is an intersection between the inside of each individual cell (including the boundaries of the cell) and the input boundary information.

According to the above-described method of the present invention, the entire range that can trace only the internal cells along line segments connecting points on vertices, edges, or neighboring faces is determined as the same space in advance in processing on a cell basis unless it is completely bounded by boundary. cells. Accordingly, the method of the present invention has the following features:

(1) Since the local processing suffices, the method of the present invention is more robust than the identification using the region growing method. Further, even if there is a defect in the boundary information, the method of the present invention can also make identification in a more robust manner than the ray crossing method using the boundary (surface) information.

(2) The processing speed of the present invention is higher than the region growing method using boundary tracking in image processing. If the number of cells is n, the processing time is on the order of O (n).

(3) The implementation is easy.

(4) Difference spaces are not classified as one space on a safe side (one space where different spaces are mixed).

(5) Since a region grows using local information until the region is bounded by the boundary cells, the method of the present invention is also applicable to multiple spaces (non-manifold connections of boundary cells).

EMBODIMENT

The following describes a specific example of the preferred embodiment of the present invention.

Figure 3:
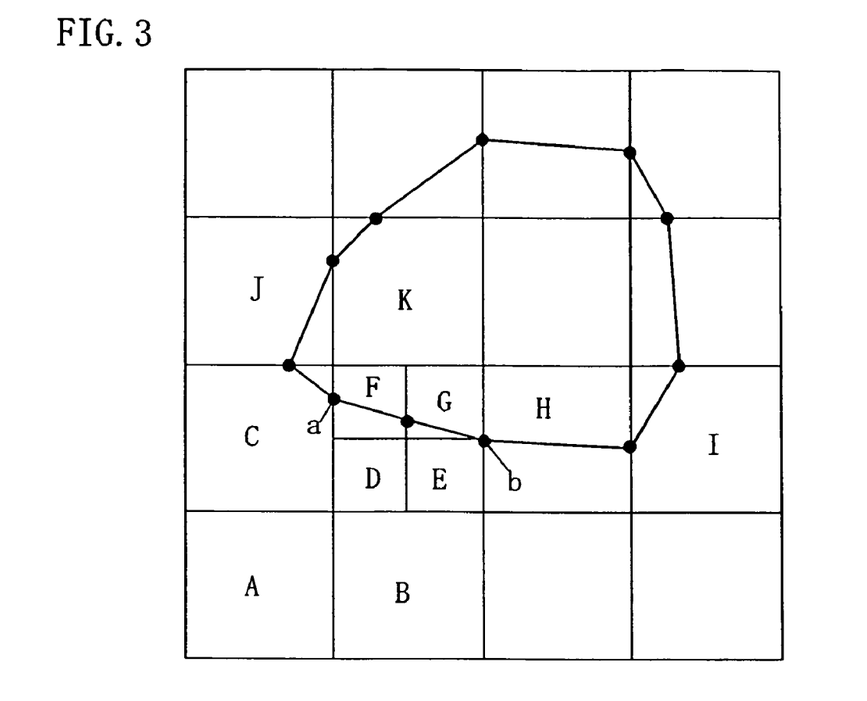
FIG. 3 shows the type of each cell and the location of each cutting point.

FIG. 3 shows the types of cells and the positions of cutting points. In FIG. 3, each square or grid represents a cell. The large cells and small cells are the representation of a two-level hierarchy. Further, black circles are cutting points, and line segments connecting the black circles indicate an inner cell face, that is, boundary data.

(Type of Cell)

The cells are classified into a non-boundary cell type, a boundary cell type, and a transit cell type. The term "non-boundary cell" refers to a cell without cutting point. The term "boundary cell" refers to a cell with one or more cutting points. The term "transit cell" refers to a cell larger in hierarchy than the other neighboring cells and having a cutting point on its boundary with the lower-level cells.

The boundary cell has a cutting point only on a cell edge or vertex. In many cases, the boundary cell has boundary data, but it may not always have cell inner faces. In FIG. 3, cell E is a boundary cell because it has cutting point b, but there in no boundary data inside the cell because the cell is tangent to the boundary at this point alone.

The "transit cell" is one type of boundary cell in terms of having a cutting point, but it differs from the boundary cell in that it can have the cutting point on a face which causes a hierarchical difference.

In FIG. 3, cells B, C, H, and K correspond to the larger cells around which a hierarchical difference occurs. Among the cells, the cell B is a non-boundary cell without a cutting point. On the other hand, although the cell K has cutting points, it is a boundary cell because the cutting points do not lie on faces which cause a hierarchical difference. As shown, only cells C and H are transit cells, each having a cutting point on a face at which the hierarchical difference occurs.

(Position of Cutting Point)

The cutting point is arranged on a cell edge or cell vertex, or in case of a transit cell, it is arranged on a cell face. In the example of FIG. 3, a cutting point a is a cutting point on a cell face as viewed from the transit cell C and on a cell edge as viewed from small cell F. Similarly, a cutting point b is a cutting point on a cell face as viewed from the transit cell H and on a cell vertex as viewed from small cells E and G. The other cutting points all lie on cell edges.

Figure 4:
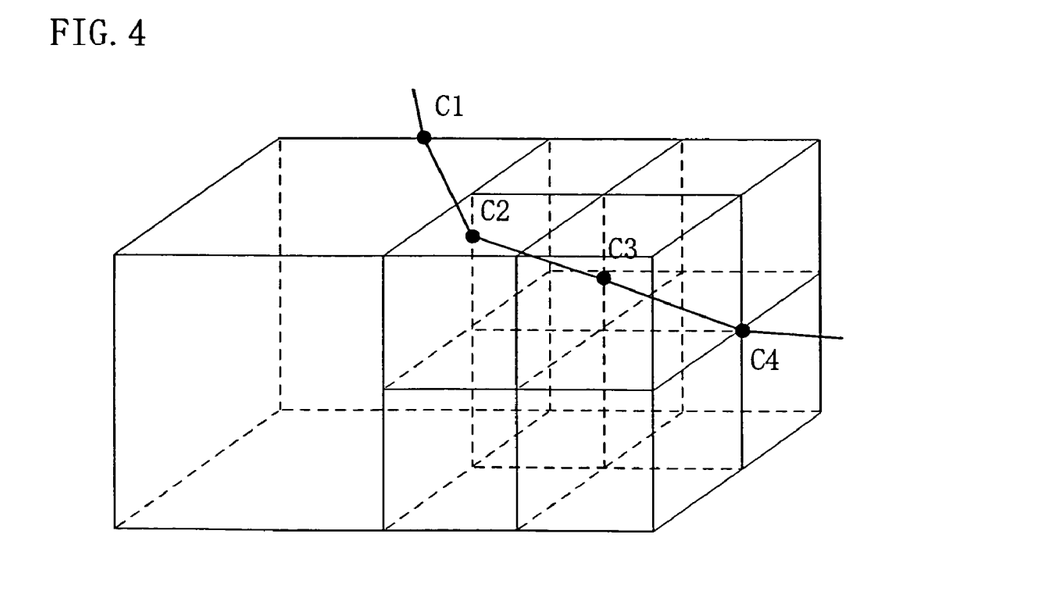
FIG. 4 shows transit cells in three dimensions.

Since FIG. 3 shows a two-dimensional model, it is hard to understand whether the cutting points of the transit cells C and H lie on an edge or face. In this regard, as shown at C2 in a three-dimensional model in FIG. 4, they lie on faces, respectively, FIG. 4 shows the transit cells in three dimensions. As shown, the cutting point C2 lies on a cell edge as viewed from the small cell, and on a cell face as viewed from the large cell on the left side. The "transit cell" is provided to allow the cutting point to be put on the cell face of the large cell in order to represent it from the standpoint of the large cell side.

Similarly, although the cutting point C4 lies on a vertex shared among four small cells, it lies on a face of a transit cell, not shown, which is supposed to be on the right side of the page.

Figure 5:
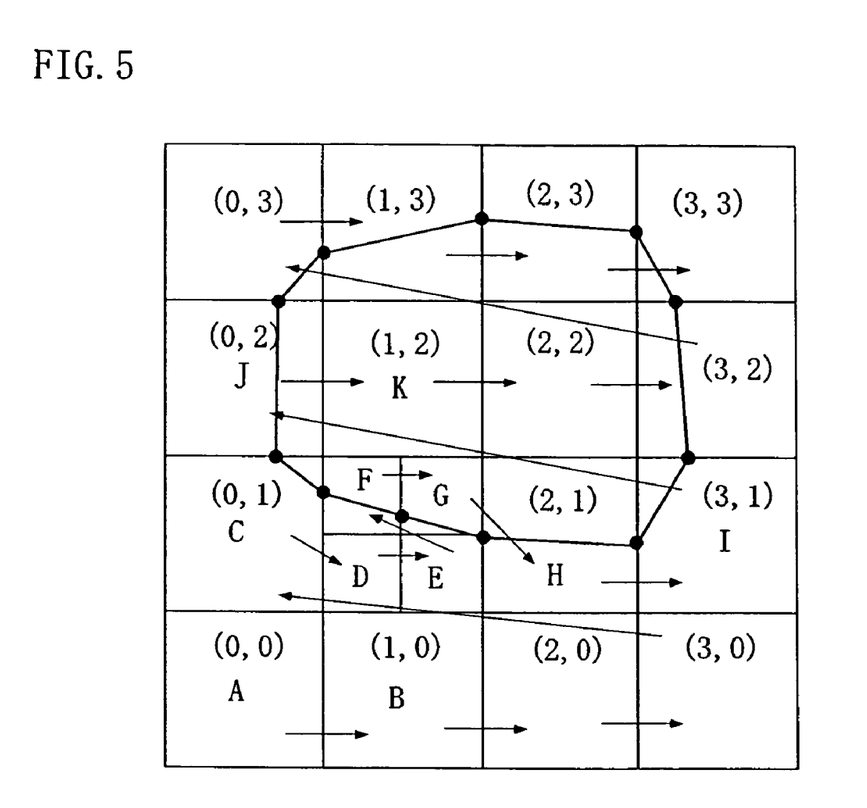
FIG. 5 shows the order of cell searching.

FIG. 5 shows the order of searching cells. As shown, the basic order of searching is such that the searching is first moved to the next in a direction to increment X in cell coordinates (X, Y), and when it reaches the end of the line, X is reset (to zero) while incrementing Y by one.

Figure 6:
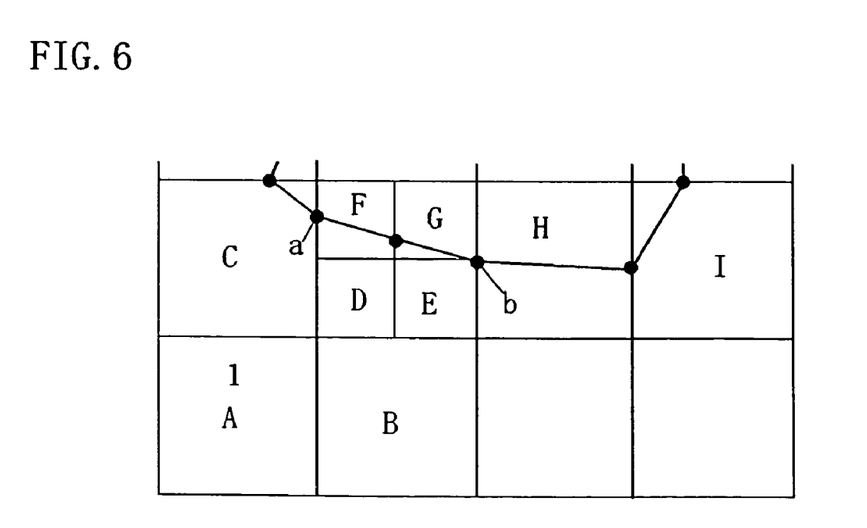
FIG. 6 is a diagrammatic illustration of the first numbering of non-boundary cells.

FIG. 6 is a diagrammatic illustration of the first numbering of non-boundary cells. As shown, the first non-boundary cell A is assigned a number (1 in this case). In this figure, the number is labeled at the center of the cell, but the number is labeled at each of the four vertices of the cell in practice. This number is stored as the "current number."

Figure 7:
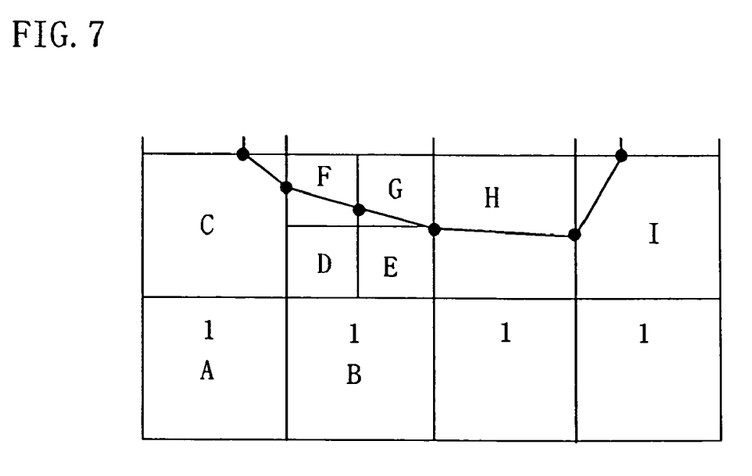
FIG. 7 is a diagrammatic illustration of the next numbering of non-boundary cells.

FIG. 7 is a diagrammatic illustration of the next numbering of non-boundary cells. As shown, in case of non-boundary cell B, the current number (1 in this case) is compared with numbers assigned to neighboring cells to assign it the smallest number (1 in this case).

Figure 8:
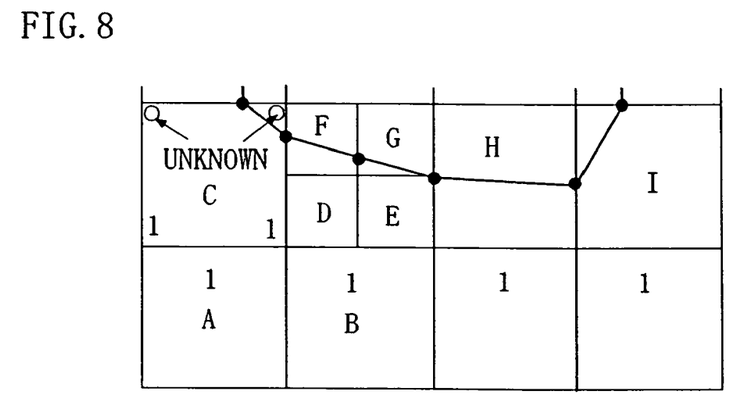
FIG. 8 is a diagrammatic illustration of the first numbering of boundary cell C.

FIG. 8 is a diagrammatic illustration of the first numbering of boundary cell C. As shown, in case of boundary cell C, since the neighboring cell A is already assigned a number (1 in this case), only the vertices sharing the boundary with the neighboring cell are assigned the number (1 in this case). Since the searching reaches the boundary cell, the "current number" is changed to the next number, 2. Further, 2 is stored as "the number of used numbers."

Figure 9:
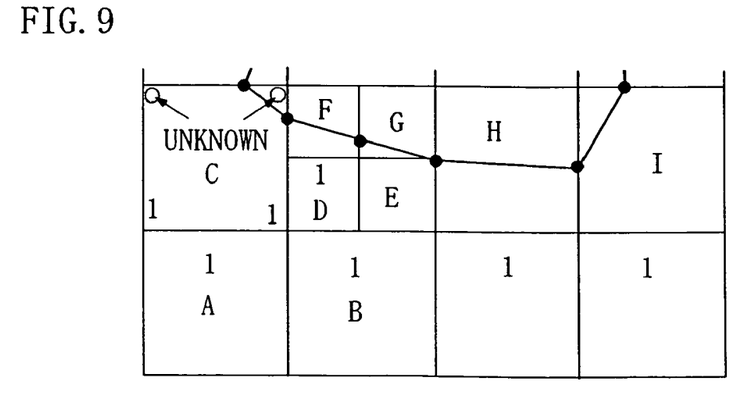
FIG. 9 is a diagrammatic illustration of the next numbering of non-boundary cell D.

FIG. 9 is a diagrammatic illustration of the numbering of the next non-boundary cell D. Although the current number is 2, since the cells bordering the cell D are assigned 1 as shown in FIG. 9, the cell D is set to 1. At this time, the "current number" is changed to 1, while conversion information indicating "2 to 1" is recorded in a conversion table.

Although the current number returns to 1 in FIG. 9, 2 might possibly have been used for another cell. The number that is not used at present but might have been used in the past cannot be found from the "current number" alone. Although it can be found if all the registered cells are checked, it is not efficient. In order to improve search efficiency, "the number of used numbers" indicating how many numbers have been used so far is stored.

Figure 10:
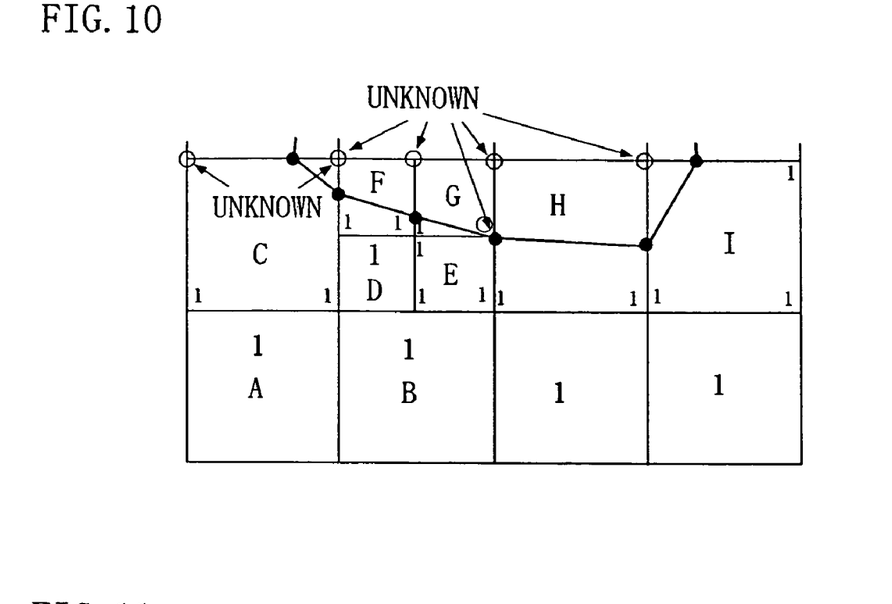
FIG. 10 illustrates the second pattern of the initial setting of boundary cell E.

FIG. 10 illustrates the second pattern of the first numbering of boundary cell E. From the neighboring cells D and B of the cell E on the left and immediately below, the three vertices of the boundary cell E can be assigned the number, but the number of the upper-right vertex is unknown. Further, since the cell E is a boundary cell, the current number and the number of used numbers are newly set in the same manner as in FIG. 6. In this case, assuming that each boundary cell is assigned a new number, respectively, five boundary cells E, F, G, H and I are newly numbered, respectively. It means that the current number remains 1 but the number of used numbers is 7 in total because the new five numbers are assigned to the five boundary cells E, F, G, H and I.

Figure 11:
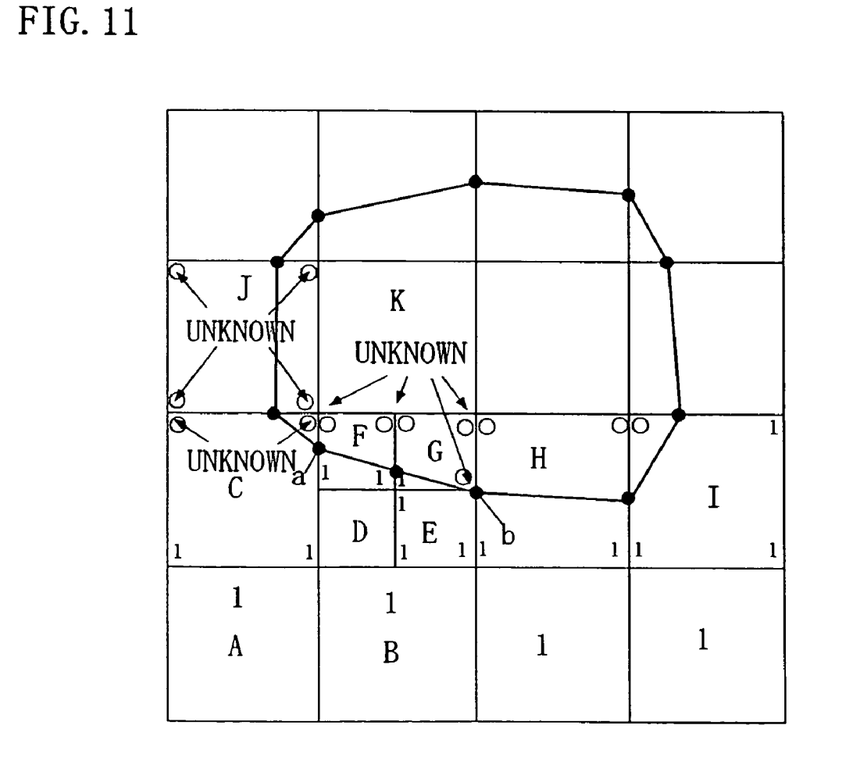
FIG. 11 illustrates the third pattern of the initial setting of boundary cell J.

FIG. 11 illustrates the third pattern of the initial setting of boundary cell J. The leftmost boundary cell J that is the second from the top has no neighboring cells whose vertices have been numbered. Therefore, all the vertices of the boundary cell J remain unknown. In this case, since the current number is also renumbered to 8, the current number and the number of used numbers are changed to 8, respectively.

Figure 12:
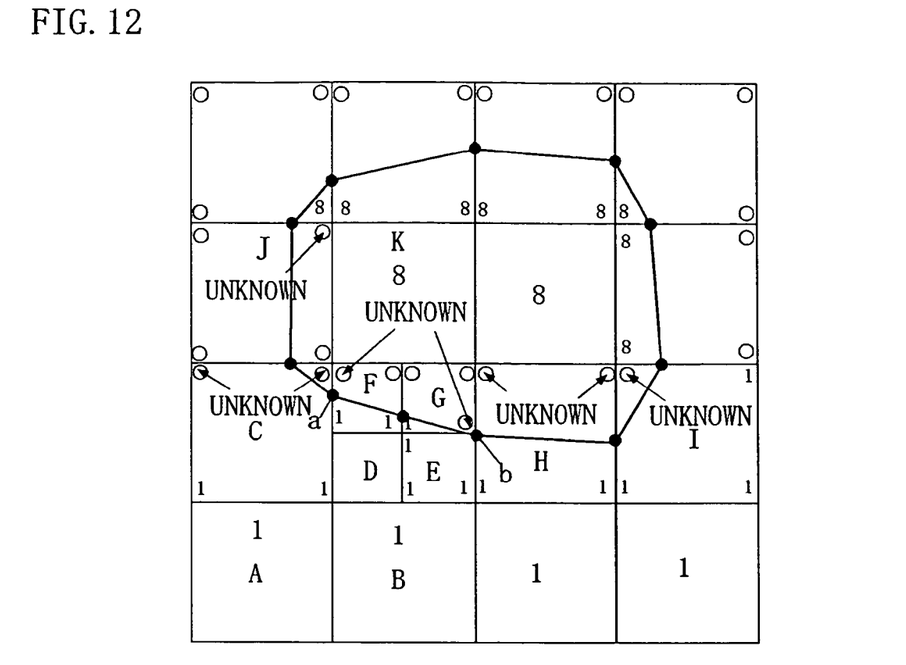
FIG. 12 is a diagrammatic illustration of the numbering of new non-boundary cell K.

FIG. 12 is a diagrammatic illustration of the number of non-boundary cell K. Since around the non-boundary cell K, there are no non-boundary cells having smaller numbers than the non-boundary cell K, or no boundary cells numbered at their cutting points shared with the non-boundary cell K, the current number (8 in this case) is assigned to the non-boundary cell K. At this point of time, material numbering is not performed on the vertices of the boundary cells shared with those of the surrounding boundary cells.

Figure 13:
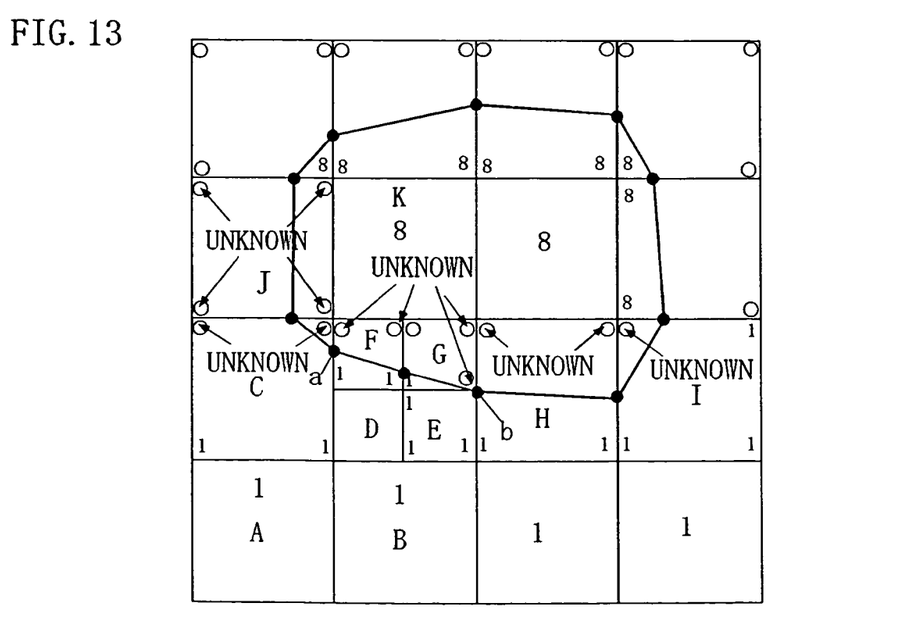
FIG. 13 is a diagrammatic illustration of the numbering of remaining cells.

FIG. 13 is a diagrammatic illustration of the numbering of the remaining cells. The vertices of the remaining cells are numbered in the same manner described above as long as they are known. Thus, all (the vertices of) the cells that could be simply numbered have been numbered up to this time.

Figure 14:
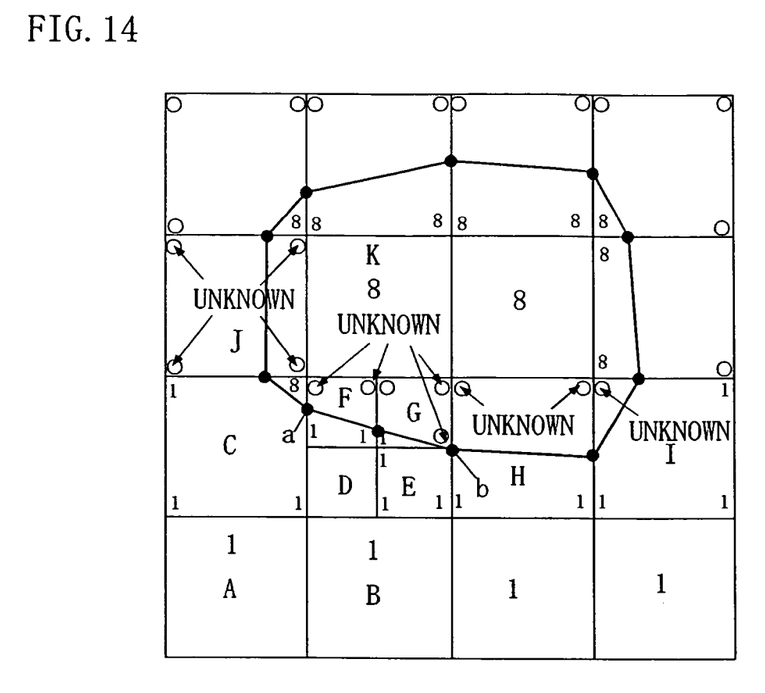
FIG. 14 is a diagrammatic illustration of the numbering of unknown points from the set surrounding values.

FIG. 14 is a diagrammatic illustration of the numbering of unknown points from the set values of the surrounding cells. The vertices whose numbers are unknown are numbered based on the set numbers and the cell inner surface positions.

When focusing attention on the leftmost cell C that is the second from the bottom, the vertices whose numbers are unknown are two points at the upper left and upper right corners. Among the two points, the upper-left vertex has two adjacent vertices one of which (lower-left vertex) has been already numbered, and there is no cutting point on the edge connecting the two vertices. Therefore, the two vertices are deemed to belong to the same region, and the number 1 is assigned to the upper-left vertex.

On the other hand, although two vertices adjacent to the upper-right vertex have been numbered (one of which (upper-left vertex) has been just numbered in the above step), there are cutting points on the edges, each connecting the upper-right vertex and each adjacent vertex, respectively. It means that the upper-right vertex belongs to a region different from those vertices. Therefore, no number can be assigned to the upper-right vertex.

Next, neighboring cells are checked. Although the three cells F, J, and K, which border the cell C on the left, immediately above, and off the upper right, respectively, share the vertex of the cell C, only the cell K located off the upper right of the cell C has a numbered common vertex (number 8). Therefore, this number is set for the vertex.

Note that since the embodiment has been described as a two-dimensional model, the description of cutting points on faces is omitted. The cutting points on faces will be described later.

Figure 15:
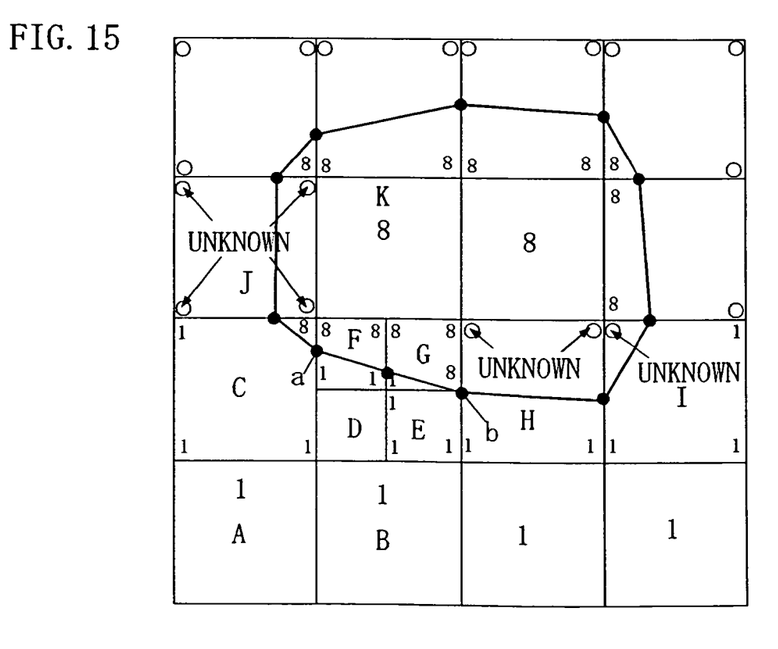
FIG. 15 is a diagrammatic illustration of the numbering of a vertex on which a cutting point lies.

FIG. 15 is a diagrammatic illustration of the numbering of a cell having a cutting point on its vertex. In FIG. 15, the numbering of one of the small cells, that is, the numbering of the unknown vertex of the lower-right cell E will be described.

Among the vertices of the cell E, only the upper-right vertex has not been numbered, and a cutting point lies on the vertex. The remaining vertices of the cell E are all assigned the number 1. Since this cell has no cell inner faces, it is deemed that the upper-right vertex belongs to the same region as the other vertices. Therefore, the upper-right vertex is assigned the same number 1 as that of the other vertices.

Further, among the small cells, the unnumbered vertices of the cell G on the upper right are numbered as follows:

The cell G has unnumbered vertices on which no cutting points lie and an unnumbered vertex on which a cutting point lies. As a result of comparison with the numbered common vertices around the cell G, it is found that the unnumbered vertices on which no cutting points lie are assigned the number 8 (the upper-left vertex is determined from the vertices of the upper and left cells, and the upper-right vertex is determined from the numbered upper-left vertex of the cell itself).

From the relation between the location of the inner face and the cutting point on the edge, it cannot be deemed that the lower-left vertex that was the only numbered vertex of the cell G before the description of FIG. 15 belongs to the same region as the other vertices. Therefore, the last unnumbered vertex cannot be assigned the number 1. Since the cutting point lies on the lower-right vertex, it is considered that the cutting point is a region boundary, that is, the vertex cannot be assigned the same number as those of the neighboring cells. When checking the direction of an inner cell face passing through the vertex, since the region of the material of the number 8 spreads more widely in the direction of the inner cell face, the vertex is included in the region of the material of the number 8.

Figure 16:
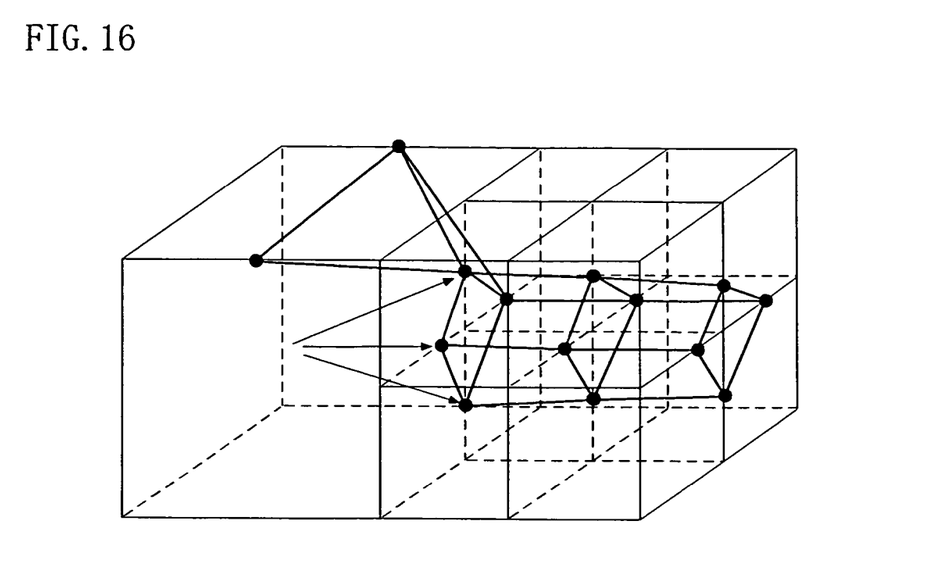
FIG. 16 is a diagrammatic illustration of the numbering of points around a point on a face.

FIG. 16 is a diagrammatic illustration of how to assign numbers to points on faces. Although FIG. 16 partially omits the details of the large cell, it is assumed that an inner cell face (boundary data) in the form of a funnel shape. That is, the open end of the funnel is placed in the left-hand large cell while the thin part of the funnel shape is placed at the center of the right-hand small cells.

The numbers of vertices arranged outside the funnel can be found from the vertices of the surrounding cells in the manner as illustrated up to FIG. 15. However, the numbers inside the funnel cannot be identified because there are cutting points on all the boundaries inside the funnel.

Figure 17:
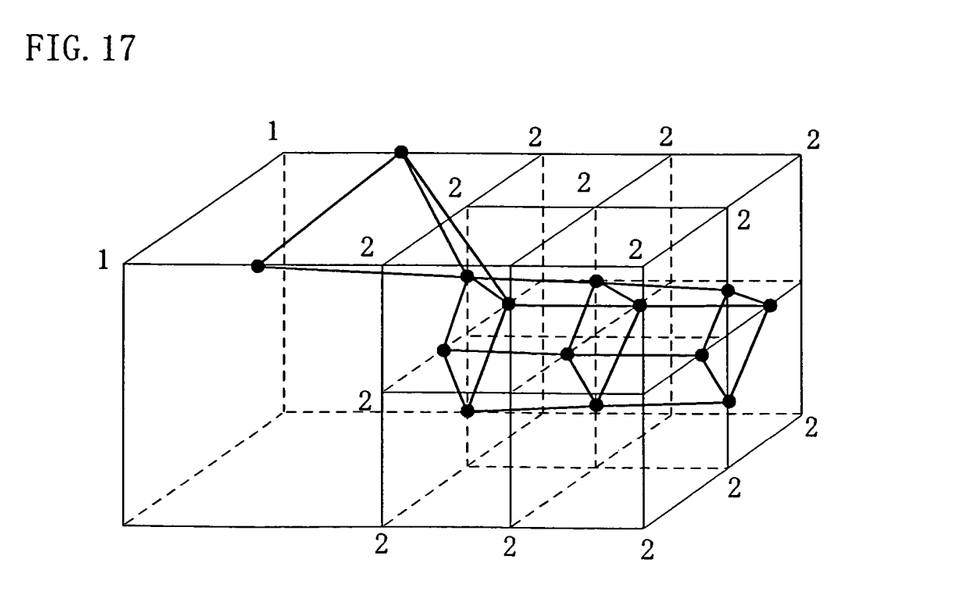
FIG. 17 illustrates the numbers of the outside vertices.

FIG. 17 shows the numbers of the outside vertices, where the outside vertices on the open-end side of the funnel are numbered 1 and the outside vertices on the neck or tube side of the funnel are numbered 2.

Figure 18:
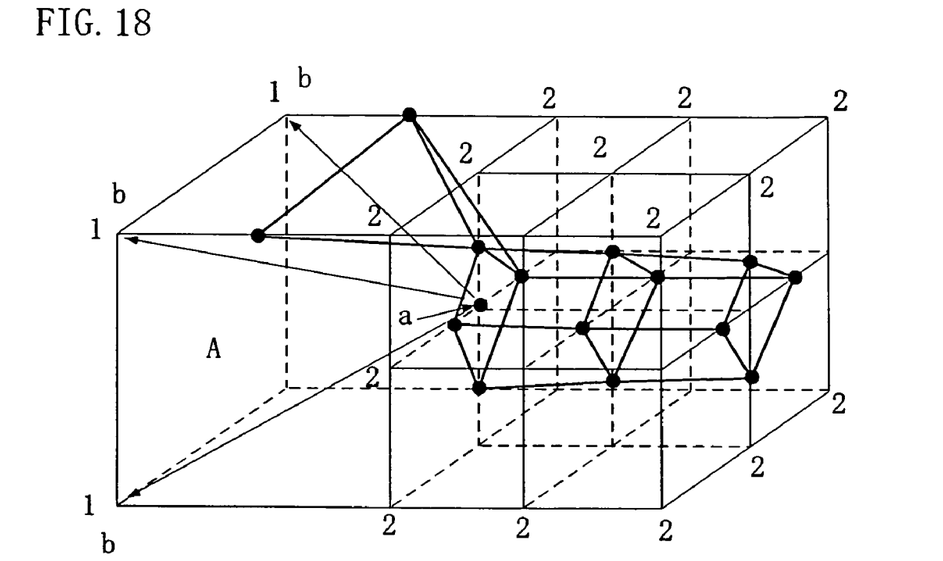
FIG. 18 is a diagrammatic illustration of how to determine the numbers inside a funnel.

FIG. 18 is a diagrammatic illustration of how to determine the numbers inside the funnel. When focusing attention on a vertex a, it is apparent that the vertex a lies on the face of transit cell A. Then, the vertex a is connected by arrow lines to the vertices b at the four corners of the cell face opposite to the face including the point a. If these lines do not intersect the inner cell face (boundary data), since it is deemed that the vertex a belongs to the same region as the vertices b, each of which is the endpoint of the arrow line from the vertex a, the same number as the corresponding vertex is assigned. In this example, the vertex a is numbered 1.

If all the four vertices belong to different regions, another connecting face of the cell (that is, the face on which a cutting point lies and which was the basis of treating the boundary cell as a transit cell) will be checked to see if there are the vertices of neighboring cells on the face. Then, connecting to these vertices is made by lines to find a vertex belonging to the same region.

Figure 19:
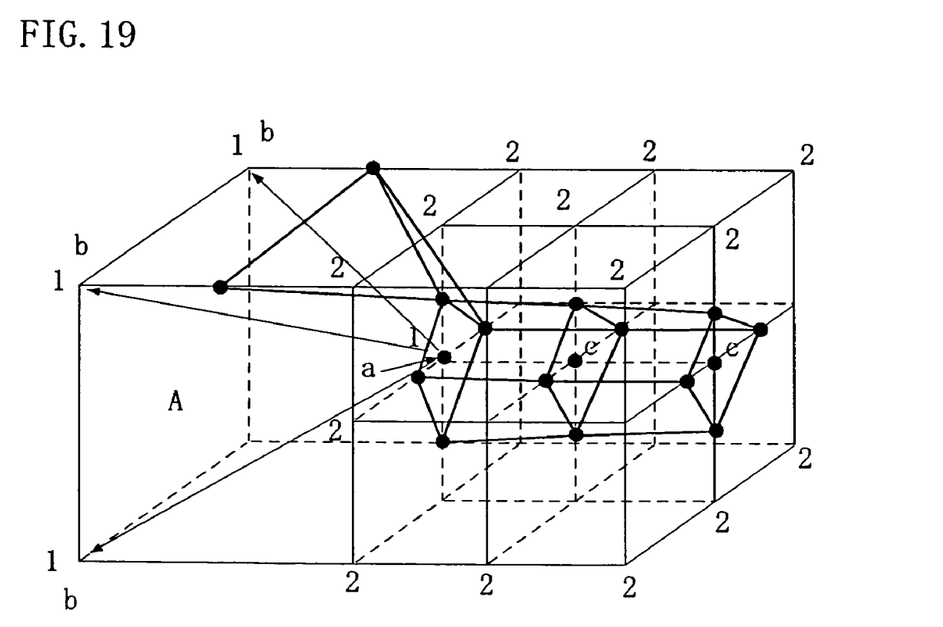
FIG. 19 is a diagrammatic illustration of how to determine the numbers of the remaining vertices.

FIG. 19 is a diagrammatic illustration of how to determine the numbers of the remaining vertices. Once the number of the vertex a that lies on the boundary with the transit cell A is determined as 1, the relationship of adjacent vertices in each small cell has only to be checked to determine the numbers of the remaining vertices (vertices C in FIG. 17) in order. In this case, the vertices C are numbered 1.

The present invention is not limited to the above-mentioned embodiment and various changes are possible without departing the scope of the present invention.

According to the method of the present invention, all pieces of external data 12 are divided in the cell division step (B) into rectangular solid cells 13 with boundary planes orthogonal to each other, and the divided cells are classified in the cell classification step (C) into boundary cells 13*a* and non-boundary cells 13*b*. Therefore, even if there is a defect in the boundary information, each piece of external data 12 will always be classified as either the boundary cell 13*a* or the non-boundary cell 13*b*.

Further, since the rectangular solid cells 13 are larger than the original boundary data, the boundary cell 13*a* can be determined as including only part of the boundary data (for example, one point in the boundary data) so that the boundary data will always be included in the boundary cells 13*a*. Even if there is a defect in the boundary information such as a loss of data, the boundary data including the loss will always be included in the boundary cell 13*a* unless the dimensions of the missing data exceed those of the rectangular solid cell 13.

Thus, the method and program of the present invention is robust against any defect in the boundary information. It has the advantages of being able to identify the boundary information even if there is a defect in the boundary information, make processing time short, make processing speed high, make implementation into a computer easy, reduce the risk of classifying different spaces as one space, extend its application to multiple spaces, etc.

These advantages make possible a wide range of applications, such as (1) simulations for structural analysis, large deformation analysis, heat and fluid analysis, flow analysis, removal machining, addition machining, and deformation machining, (2) simulations and inspections of an object model in which a living body such as a human body is mixed with artifacts and designing and machining of the artifacts, and (3) designing, analyzing, machining, assembling, and testing in cases where natural things and artifacts, like the Earth's crusts and buildings, are mixed.

It should be noted that the present invention is not limited to the above-mentioned embodiment and various changes are possible without departing from the scope of the present invention.

The invention claimed is:

1. A method for labeling multi material data, for a sequence of processing steps using a computer, such that the insides/outsides of two-dimensional or three-dimensional boundary surfaces may be determined, the steps including acquisition of external data, storage of cell data through octree division of the external data, and simulation using the cell data, the method comprising:

(S1) acquiring the external data composed of boundary data and physical property values of an object;
(A) inputting the external data into a computer;
(B) dividing the external data into rectangular solid cells having boundary planes orthogonal to each other;
(C) classifying each of the divided cells into a boundary cell including the boundary data, and a non-boundary cell not including the boundary data;
(D) classifying the vertices of each cell into multiple spaces partitioned by the boundary data;
(S3) performing a simulation using the physical property values for each cell; and
(S4) outputting simulation results,
wherein step (C) comprises the steps of:
further classifying each of the boundary cells into a first type cell and a second type cell, the first type cell having a cutting point at which an edge line or vertex is cut by the boundary data, the second type cell having a cutting point that lies on a boundary with another cell of different hierarchy, and the second type cell being larger than the another cell; and
assigning a material number to each cell vertex, and
wherein step (D) further comprises:
(D1) assigning all the non-boundary cells space numbers different for respective spaces partitioned by boundary data; and
(D2) assigning each vertex of the boundary cell the space number of the neighboring non-boundary cell that is not partitioned by the boundary data.

2. A method for labeling multi material data according to claim 1, wherein step (D2) comprises a step of assigning a vertex matching the boundary data either of the space numbers of two neighboring non-boundary cells.

3. A method for labeling multi material data according to claim 1, wherein step (B) comprises a step of re-dividing the rectangular solid cells by octree division until a number of cutting points enough to reconstruct boundary shape elements forming the boundary face included in the external data are obtained.

4. A method for labeling multi material data according to claim 1, wherein step (B) comprises a step of dividing voxel data into rectangnlar solid cells of the same size.

5. A method for labeling multi material data according to claim 1, wherein step (D1) comprises a step of scanning all the rectangular solid cells repeatedly in sequence, or in recursive processing, in the three directions of X, Y, and Z.

* * * * *